US012787788B2

(12) United States Patent
Ishikawa et al.

(10) Patent No.: US 12,787,788 B2
(45) Date of Patent: Nov. 3, 2026

(54) POWER SEMICONDUCTOR DEVICE

(71) Applicant: Mitsubishi Electric Corporation, Tokyo (JP)

(72) Inventors: Hirotaku Ishikawa, Tokyo (JP); Koki Kishimoto, Tokyo (JP); Kazutake Kadowaki, Tokyo (JP); Kunihiko Tajiri, Tokyo (JP); Yoshitaka Miyaji, Tokyo (JP); Hiroki Shiota, Tokyo (JP); Yasutomo Otake, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 458 days.

(21) Appl. No.: 18/284,068

(22) PCT Filed: Apr. 2, 2021

(86) PCT No.: PCT/JP2021/014323

§ 371 (c)(1),
(2) Date: Sep. 26, 2023

(87) PCT Pub. No.: WO2022/208869

PCT Pub. Date: Oct. 6, 2022

(65) Prior Publication Data

US 2024/0194613 A1 Jun. 13, 2024

(51) Int. Cl.
*H10W 42/20* (2026.01)
*H10W 74/47* (2026.01)
(Continued)

(52) U.S. Cl.
CPC ......... *H10W 42/20* (2026.01); *H10W 74/473* (2026.01); *H10W 76/17* (2026.01);
(Continued)

(58) Field of Classification Search
CPC ... H10W 42/20; H10W 72/00; H10W 72/884; H10W 74/47; H10W 74/473;
(Continued)

(56) References Cited

U.S. PATENT DOCUMENTS 4,833,334 A 5/1989 Valy et al.
6,384,128 B1 5/2002 Wadahara et al.
(Continued)

FOREIGN PATENT DOCUMENTS

DE 112017006387 T5 8/2019
JP H01-300547 A 12/1989
JP H03-208364 A 9/1991

OTHER PUBLICATIONS

International Search Report and Written Opinion mailed on Jul. 6, 2021, received for PCT Application PCT/JP2021/014323, filed on Apr. 2, 2021, 8 pages including English Translation.
(Continued)

*Primary Examiner* — Brook Kebede
(74) *Attorney, Agent, or Firm* — XSENSUS LLP

(57) ABSTRACT

A power semiconductor according to the present disclosed technology is a case-type power semiconductor device, in which a case is formed by mixing a heavy element material and a conductive material with a material having high processability, the conductive material is not a light metal, and the electric resistance of the case is 1.0 E5 to 1.0 E11 [Ω].

In addition, the power semiconductor according to the present disclosed technology is a transfer mold-type power semiconductor device, and includes a transfer mold-type sealing resin including a sealing resin containing a heavy element material and a sealing resin containing a conductive material, in which the conductive material of the sealing resin containing a conductive material is not a light metal.

5 Claims, 5 Drawing Sheets

(51) Int. Cl.
*H10W 76/17* (2026.01)
*H10W 72/00* (2026.01)
*H10W 90/00* (2026.01)

(52) U.S. Cl.
CPC ........ *H10W 72/884* (2026.01); *H10W 90/734* (2026.01); *H10W 90/754* (2026.01)

(58) Field of Classification Search
CPC ... H10W 76/17; H10W 90/00; H10W 90/734; H10W 90/754; H10W 42/40; H10W 42/271; H10W 90/701; H10W 90/756
See application file for complete search history.

(56) References Cited

U.S. PATENT DOCUMENTS

2009/0102040 A1* 4/2009 Specht .................. H01L 23/043
257/690
2012/0023737 A1 2/2012 Thomsen, III et al.
2017/0358540 A1* 12/2017 Min ...................... H01L 23/552
2019/0109095 A1 4/2019 Min et al.
2020/0211978 A1* 7/2020 Pei ........................ H01L 23/552
2021/0111130 A1 4/2021 Tanishita et al.

OTHER PUBLICATIONS

Extended European search report issued on Jun. 28, 2024, in corresponding European patent Application No. 21935030.3, 20 pages.
Partial Supplementary European Search Report issued Apr. 22, 2024, in corresponding European Patent Application No. 21935030.3, 14pp.

* cited by examiner

POWER SEMICONDUCTOR DEVICE

CROSS-REFERENCE TO RELATED APPLICATION

This application is based on PCT filing PCT/JP2021/014323, filed Apr. 2, 2021, the entire contents of which are incorporated herein by reference.

TECHNICAL FIELD

The present disclosed technology relates to a power semiconductor device.

BACKGROUND ART

In high-altitude environments and space environments (hereinafter referred to as "space environment or the like"), a large amount of cosmic rays are falling. A semiconductor chip in a semiconductor device placed in a radiation environment such as a space environment malfunctions, and an insulating member deteriorates.

Various techniques are disclosed for packaging semiconductor devices used in a radiation environment such as a space environment. For example, there is known a radiation resistant package implement by mixing or laminating heavy elements such as lead and tungsten into a plastic molding material (For example, Patent Literature 1).

CITATION LIST

Patent Literature

Patent Literature 1: Japanese Patent Application Laid-Open No. Hei 1-300547

SUMMARY OF INVENTION

Technical Problem

Meanwhile, since power semiconductor devices for aircraft are also used at high altitude, it is necessary to take measures so as not to be adversely affected by cosmic rays. A power semiconductor device for aircraft has a feature that a use voltage is larger than that of a semiconductor device for space use. Even when the package according to the related art is used in a power semiconductor device for an aircraft, since a use voltage is large, deterioration of insulation performance due to charging of cosmic rays is a problem.

An object of the present disclosed technology is to solve the above problem and to provide a power semiconductor device in which dielectric breakdown does not occur in addition to reduction of malfunction of a semiconductor chip caused by cosmic rays.

Solution to Problem

A power semiconductor according to the present disclosed technology is a case-type power semiconductor device, in which a case is formed by mixing a heavy element material and a conductive material with a material having high processability, the conductive material is not a light metal, and electric resistance of the case is 1.0 E5 to 1.0 E11 [Ω].

In addition, the power semiconductor according to the present disclosed technology is a transfer mold-type power semiconductor device including a transfer mold-type sealing resin including a sealing resin containing a heavy element material and a sealing resin containing a conductive material, wherein the conductive material of the sealing resin containing a conductive material is not a light metal.

Advantageous Effects of Invention

Since the power semiconductor device according to the present disclosed technology has the above-described configuration, there is an effect that malfunction of a semiconductor chip generated by cosmic rays is reduced and dielectric breakdown is not caused.

DESCRIPTION OF EMBODIMENTS

First Embodiment

Figure 1:
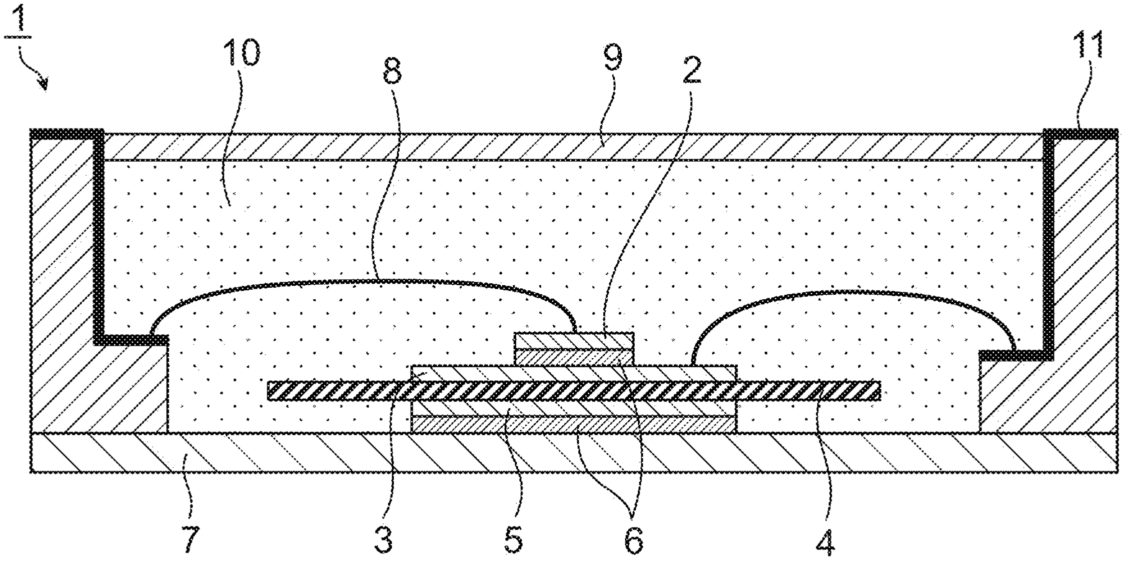
FIG. 1 is a cross-sectional view illustrating a case-type power semiconductor device (1) according to a first embodiment.

FIG. 1 is a cross-sectional view illustrating a power semiconductor device (case type) 1 according to a first embodiment. In a power semiconductor device (case type) 1 illustrated in FIG. 1, an insulating substrate 4 and a semiconductor chip 2 are covered with a potting type insulating sealing resin 10 using a case 9 as an enclosure.

As illustrated in FIG. 1, a case-type power semiconductor device (case type) 1 according to the first embodiment includes the semiconductor chip 2, an upper electrode 3, the insulating substrate 4, a lower electrode 5, a solder 6, a base plate 7, a wire 8, the case 9, the sealing resin 10, and an external terminal 11.

The case 9 is formed by mixing a heavy element material and a conductive material with a material having high processability. The material having high processability may be, for example, a thermosetting resin or the like. Here, the heavy element material intended by the present disclosed technology is a heavy metal represented by W or Pb, or a compound with a heavy metal such as tungsten oxide. In addition, the conductive material intended by the present disclosed technology is, for example, carbon black, carbon fiber, or a material equivalent thereto, and does not mean a light metal represented by Al. By not using a light metal for the conductive material, weight reduction is achieved. A more preferable condition is that the heavy element material and the carbon-based conductive material are mixed at a ratio such that the entire electric resistance value is from 1.0 E5 to 1.0 E11 [Ω].

The lower electrode 5 is bonded onto the base plate 7 by the solder 6. The insulating substrate 4 and the upper electrode 3 are arranged in this order on the lower electrode 5. The upper electrode 3 and the lower electrode 5 are desirably formed of a metal having low electric resistance, such as copper or aluminum.

The semiconductor chip 2 is bonded onto the upper electrode 3 by the solder 6. The semiconductor chip 2 and the external terminal 11 are electrically connected by the wire 8. For connection of the semiconductor chip 2 to the upper electrode 3, a silver bonding material may be used instead of the solder 6. Similarly, the solder 6 may be used for connection between the upper electrode 3 and the insulating substrate 4, or a silver bonding material may be used instead of the solder 6.

The power semiconductor device (case type) 1 is surrounded by the case 9, and the inside of the case 9 is filled with the sealing resin 10.

The base plate 7 is desirably formed of a metal having high thermal conductivity, such as copper or aluminum.

It is desirable that the wire 8 is formed of metal having low electric resistance, such as copper or aluminum.

The heavy element material mixed in the case 9 contributes to preventing the entrance of cosmic rays into the semiconductor chip 2. The conductive material mixed in the case 9 contributes to preventing the charging of cosmic rays. More specifically, the conductive material mixed in the case 9 prevents local charging in the vicinity of the surface of the case 9 due to cosmic rays, and prevents dielectric breakdown occurring at the interface between the external terminal 11 and the case 9.

Since the power semiconductor device (case type) 1 according to the first embodiment illustrated in FIG. 1 has the above-described configuration, radiation resistance and antistatic properties are imparted, and electrical insulation performance is improved. By this action, the power semiconductor device (case type) 1 according to the first embodiment has an effect of reducing malfunction of the semiconductor chip 2 caused by cosmic rays and not causing dielectric breakdown.

With development of a direct lead bonding (DLB) technology, a transfer mold-type package structure can also be implemented. The present disclosed technology can also be applied to a transfer mold-type package structure.

Figure 2:
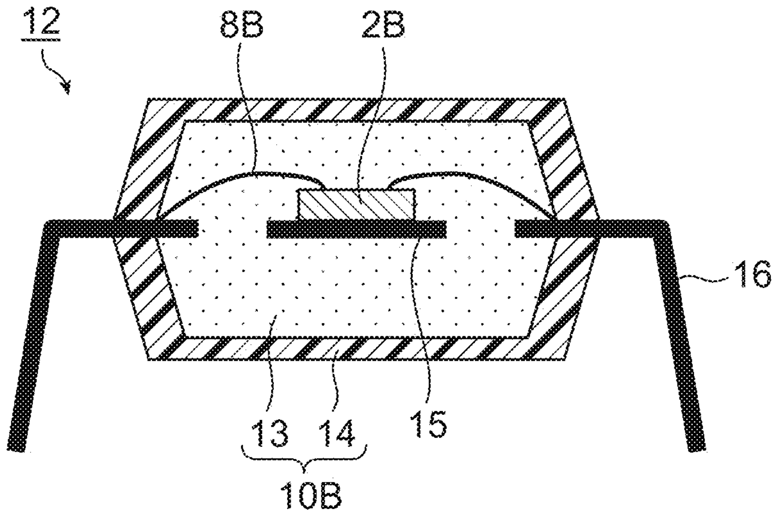
FIG. 2 is a cross-sectional view illustrating a transfer mold-type power semiconductor device (12) according to the first embodiment.

FIG. 2 is a cross-sectional view illustrating a power semiconductor device (transfer mold type) 12 according to the first embodiment. As illustrated in FIG. 2, the power semiconductor device (transfer mold type) 12 includes a semiconductor chip 2B, a wire 8B, a transfer mold-type sealing resin 10B including a sealing resin 13 containing a heavy element material and a sealing resin 14 containing a conductive material, a lead frame 15, and a lead terminal 16.

The semiconductor chip 2B is mounted on the lead frame 15. Note that the semiconductor chip 2B may be, for example, an element such as an IGBT or a MOSFET, and may include one element or a plurality of elements. When the semiconductor chip 2B includes a plurality of elements, the elements used may be of the same type or different types.

The lead terminal 16 and the semiconductor chip 2B are electrically connected by the wire 8B.

The transfer mold-type sealing resin 10B covering the power semiconductor device (transfer mold type) 12 has a two-layer structure, an inner layer is the sealing resin 13 containing a heavy element material, and an outer layer is the sealing resin 14 containing a conductive material. The sealing resin 13 containing a heavy element material absorbs radiation. The sealing resin 14 containing a conductive material prevents charging.

With the above configuration, in the power semiconductor device (transfer mold type) 12 according to the first embodiment, the amount of cosmic rays entering the semiconductor chip 2B is reduced, and local charging in the vicinity of the surface of the transfer mold-type sealing resin 10B due to the cosmic rays is prevented. In addition, in the power semiconductor device (transfer mold type) 12, dielectric breakdown at the interface between the lead terminal 16 and the sealing resin 14 containing a conductive material is prevented.

Second Embodiment

A second embodiment is an aspect in which, in the power semiconductor device (transfer mold type) 12 described in the first embodiment, a portion where dielectric breakdown is likely to occur is further devised. In the second embodiment, the same reference numerals as those in the first embodiment are used unless otherwise distinguished. Further, the description overlapping with the first embodiment is appropriately omitted.

Figure 3:
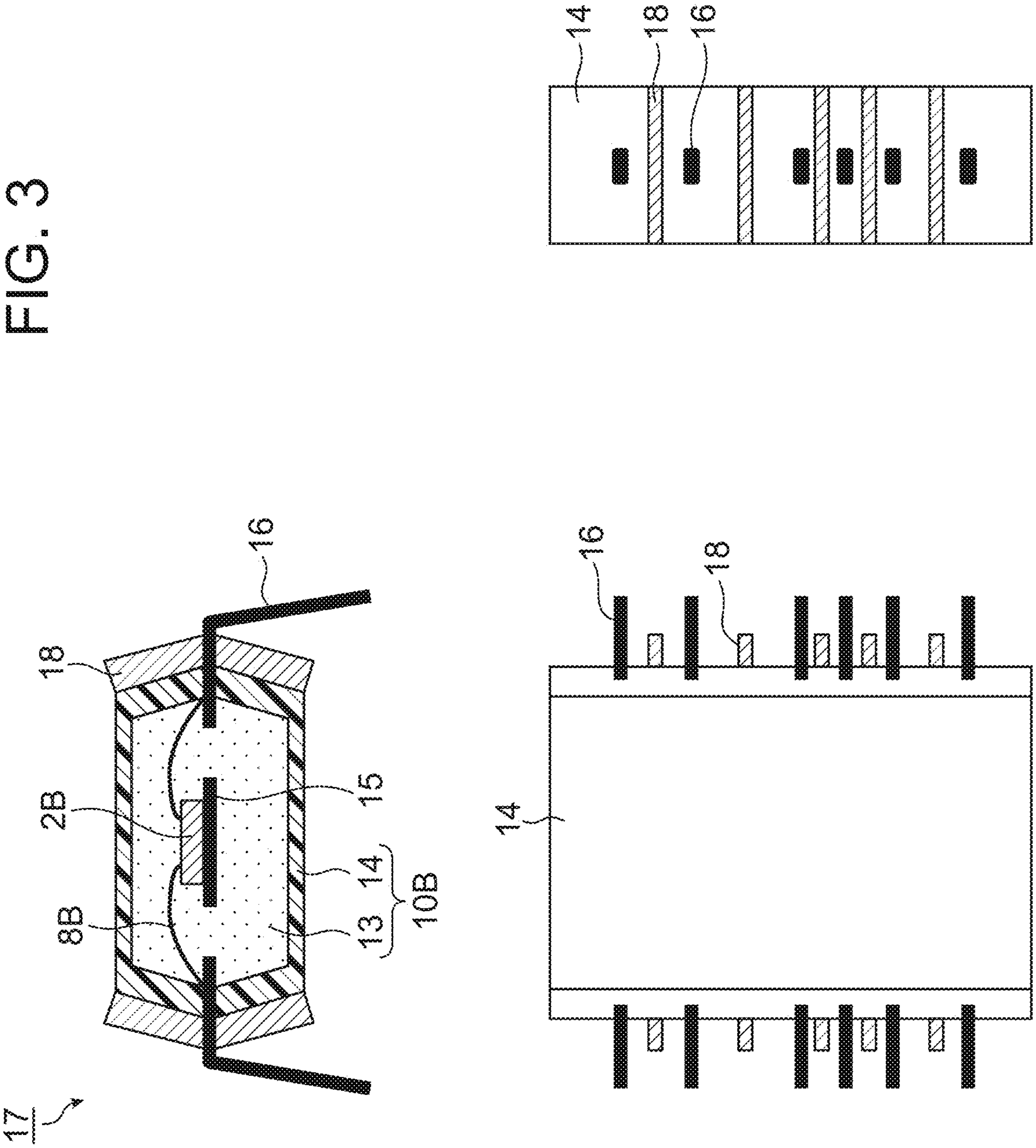
FIG. 3 is a cross-sectional view, a side view, and a bottom view illustrating a transfer mold-type power semiconductor device (17) according to a second embodiment.

FIG. 3 is a cross-sectional view, a side view, and a bottom view illustrating a power semiconductor device (transfer mold type) 17 according to the second embodiment. As shown in FIG. 3, the power semiconductor device (transfer mold type) 17 according to the second embodiment includes a barrier wall 18 on a surface of an outer layer of a sealing resin 14 containing a conductive material.

In general, in a transfer mold-type semiconductor device, a portion where dielectric breakdown is likely to occur can be specified. A portion where dielectric breakdown is likely to occur in FIG. 2 according to the first embodiment will be described. The portion is between the lead terminal 16 and another adjacent lead terminal 16, and is the surface of the sealing resin 14 containing a conductive material.

As shown in FIG. 3, a required number of barrier walls 18 are provided on the surface of the sealing resin 14 containing a conductive material in such a way as to partition the lead terminal 16 from another adjacent lead terminal 16. The barrier wall 18 increases a creepage distance between the lead terminal 16 and another adjacent lead terminal 16 to improve insulation performance.

With the above configuration, the power semiconductor device (transfer mold type) 17 according to the second embodiment has an effect of increasing the creepage distance between the lead terminal 16 and another adjacent lead terminal 16 and improving the insulation performance, in addition to the effects described in the first embodiment.

Note that the barrier wall 18 may be provided on the surface of the case 9 of the power semiconductor device (case type) 1 illustrated in FIG. 1. Providing the barrier wall 18 has an effect of increasing the creepage distance and improving the insulation performance even in the power semiconductor device (case type) 1.

Third Embodiment

A third embodiment is also an aspect in which the power semiconductor device (transfer mold type) 12 described in the first embodiment is further devised at a portion where dielectric breakdown is likely to occur. In the third embodiment, the same reference numerals as those used in the above-described embodiments are used unless otherwise specified. Further, the description overlapping with the above-described embodiments is appropriately omitted.

Figure 4:
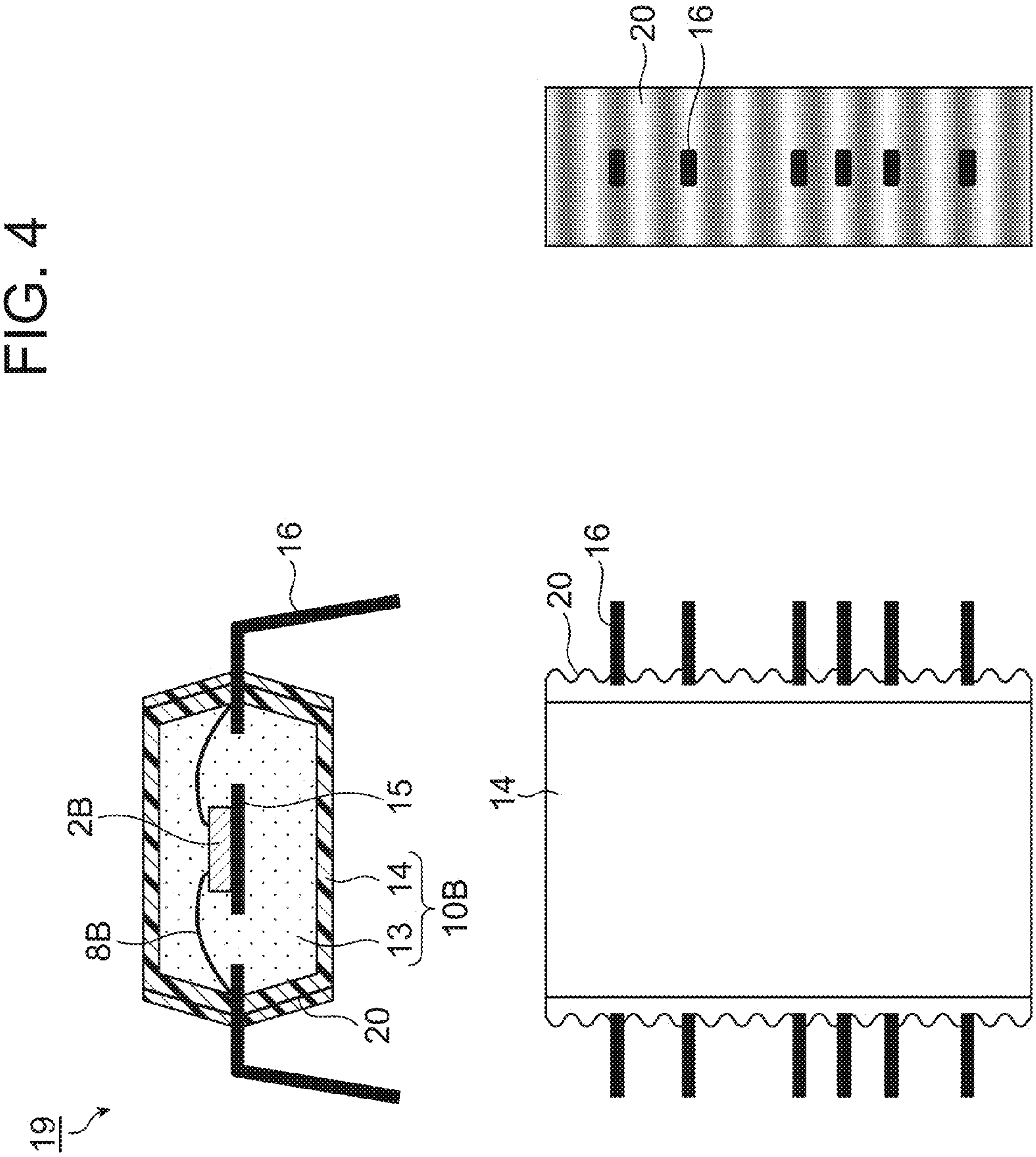
FIG. 4 is a cross-sectional view, a side view, and a bottom view of a transfer mold-type power semiconductor device (19) according to a third embodiment.

FIG. 4 is a cross-sectional view, a side view, and a bottom view of a power semiconductor device (transfer mold type) 19 according to the third embodiment. As illustrated in FIG. 4, the power semiconductor device (transfer mold type) 19 according to the third embodiment includes a wavy structure 20.

The wavy structure 20 is obtained by literally waving the surface of the sealing resin 14 containing a conductive material. The wavy structure 20 increases the creepage distance between the lead terminal 16 and another adjacent lead terminal 16, and improves the insulation performance.

With the above configuration, the power semiconductor device (transfer mold type) 19 according to the third embodiment has an effect of increasing the creepage distance between the lead terminal 16 and another adjacent lead terminal 16 and improving the insulation performance, in addition to the effects described in the first embodiment.

Fourth Embodiment

A fourth embodiment is an aspect in which antistatic properties are further devised in the power semiconductor device (transfer mold type) 12 (12, 17, 19) described in the previously described embodiments. In the fourth embodiment, the same reference numerals as those used in the above-described embodiments are used unless otherwise specified. Further, the description overlapping with the above-described embodiments is appropriately omitted.

Figure 5:
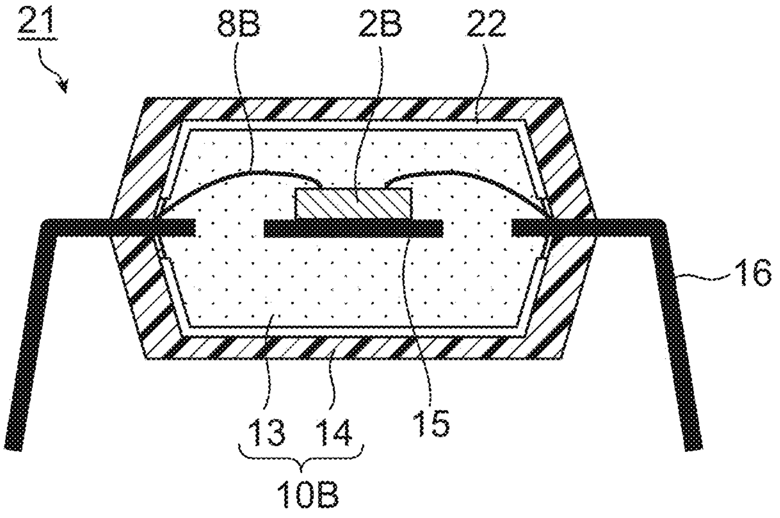
FIG. 5 is a cross-sectional view illustrating a transfer mold-type power semiconductor device (21) according to a fourth embodiment.

FIG. 5 is a cross-sectional view illustrating a power semiconductor device (transfer mold type) 21 according to the fourth embodiment. As illustrated in FIG. 5, the power semiconductor device (transfer mold type) 21 according to the fourth embodiment includes a metal layer 22.

The metal layer 22 is provided between the sealing resin 13 containing a heavy element material and the sealing resin 14 containing a conductive material. In addition, the metal layer 22 is grounded.

As described above, the sealing resin 14 containing a conductive material disperses charges generated by cosmic rays and prevents local charging. However, in a case where the amount of electric charges generated by cosmic rays is large, electric field enhancement due to charging cannot be prevented only by the sealing resin 14 containing a conductive material.

The metal layer 22 removes electric charge generated by cosmic rays and contributes to further improvement in electrification resistance.

With the above configuration, the power semiconductor device (transfer mold type) 21 according to the fourth embodiment has the effect of removing the charge generated by the cosmic ray because of the grounding of the metal layer 22 and further improving the electrification resistance, in addition to the effect described in the first embodiment.

Fifth Embodiment

A fifth embodiment is an aspect in which an improvement in radiation resistance is devised in the power semiconductor device (transfer mold type) 12 (12, 17, 19, 21) described in the previously described embodiments. In the fifth embodiment, the same reference numerals as those used in the above-described embodiments are used unless otherwise specified. Further, the description overlapping with the above-described embodiments is appropriately omitted.

Figure 6:
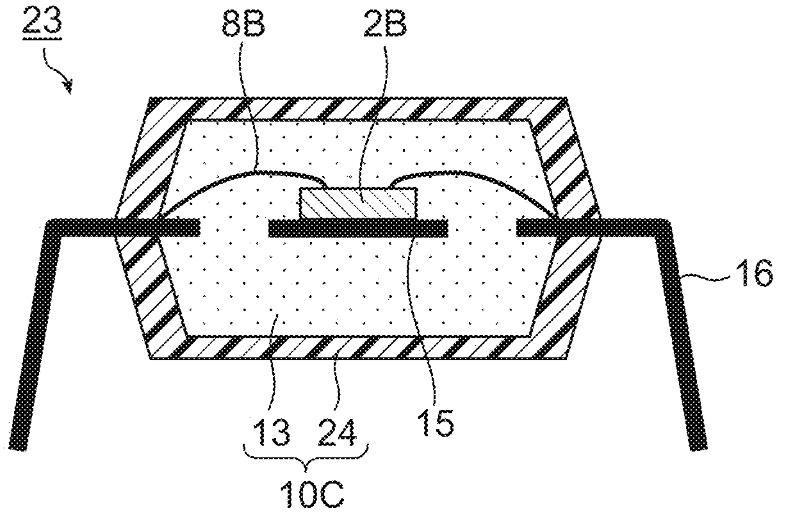
FIG. 6 is a cross-sectional view illustrating a transfer mold-type power semiconductor device (23) according to a fifth embodiment.

FIG. 6 is a cross-sectional view illustrating a power semiconductor device (transfer mold type) 23 according to the fifth embodiment. As illustrated in FIG. 6, the power semiconductor device (transfer mold type) 23 according to the fifth embodiment uses a mixed transfer mold resin 24 instead of the sealing resin 14 containing a conductive material. The mixed transfer mold resin 24 is a transfer mold resin in which a heavy element material and a conductive material are mixed.

Since the mixed transfer mold resin 24 contains a heavy element material, cosmic rays are prevented from entering the package. The fact that the mixed transfer mold resin 24 contains the heavy element material means that the heavy element material is used more than the case of using only the sealing resin 13 containing the heavy element material, and the radiation resistance is improved.

With the above configuration, the power semiconductor device (transfer mold type) 23 according to the fifth embodiment has an effect of improving radiation resistance in addition to the effect described in the first embodiment.

Sixth Embodiment

A sixth embodiment shows a modification in which a part of the configuration shown in the fifth embodiment is changed. In the sixth embodiment, the same reference numerals as those used in the above-described embodiments are used unless otherwise specified. Further, the description overlapping with the above-described embodiments is appropriately omitted.

Figure 7:
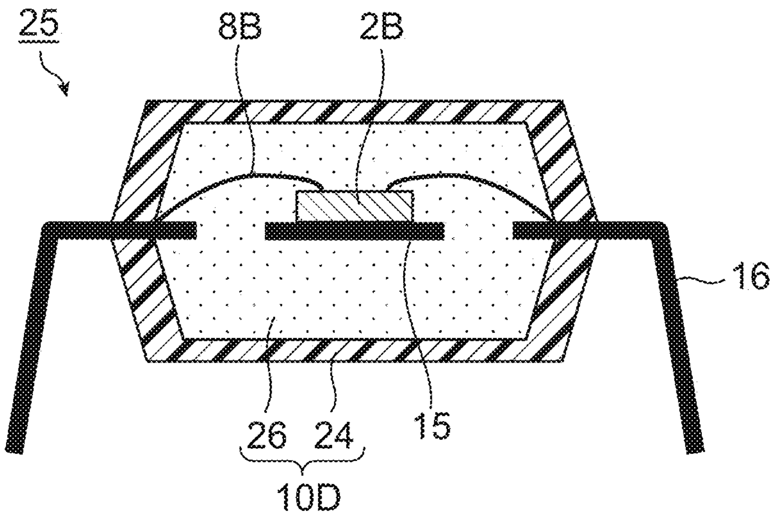
FIG. 7 is a cross-sectional view illustrating a transfer mold-type power semiconductor device (25) according to a sixth embodiment.

FIG. 7 is a cross-sectional view illustrating a power semiconductor device (transfer mold type) 25 according to the sixth embodiment. As illustrated in FIG. 7, the power semiconductor device (transfer mold type) 25 according to the sixth embodiment uses a non-mixed transfer mold resin 26 instead of the sealing resin 13 containing a heavy element material. The non-mixed transfer mold resin 26 is a transfer mold resin in which a heavy element material is not mixed.

As described in the fifth embodiment, since the mixed transfer mold resin 24 contains a heavy element material, cosmic rays are prevented from entering the package. Therefore, when the mixed transfer mold resin 24 is used, radiation resistance can be ensured without using the sealing resin 13 containing a heavy element material.

As shown in the sixth embodiment, in the present disclosed technology, a heavy element material may be used in any layer, and a conductive material may be also used in any layer.

With the above configuration, in the power semiconductor device (transfer mold type) 25 according to the sixth embodiment, the amount of cosmic rays entering the semiconductor chip 2B is reduced, and local charging in the vicinity of the surface of the transfer mold-type sealing resin 10C due to the cosmic rays is prevented.

Seventh Embodiment

A seventh embodiment is an aspect in which improvement in radiation resistance is devised in the power semiconductor device (case type) 1 described in the first embodiment. In the seventh embodiment, the same reference numerals as those used in the above-described embodiments are used unless otherwise specified. Further, the description overlapping with the above-described embodiments is appropriately omitted.

Figure 8:
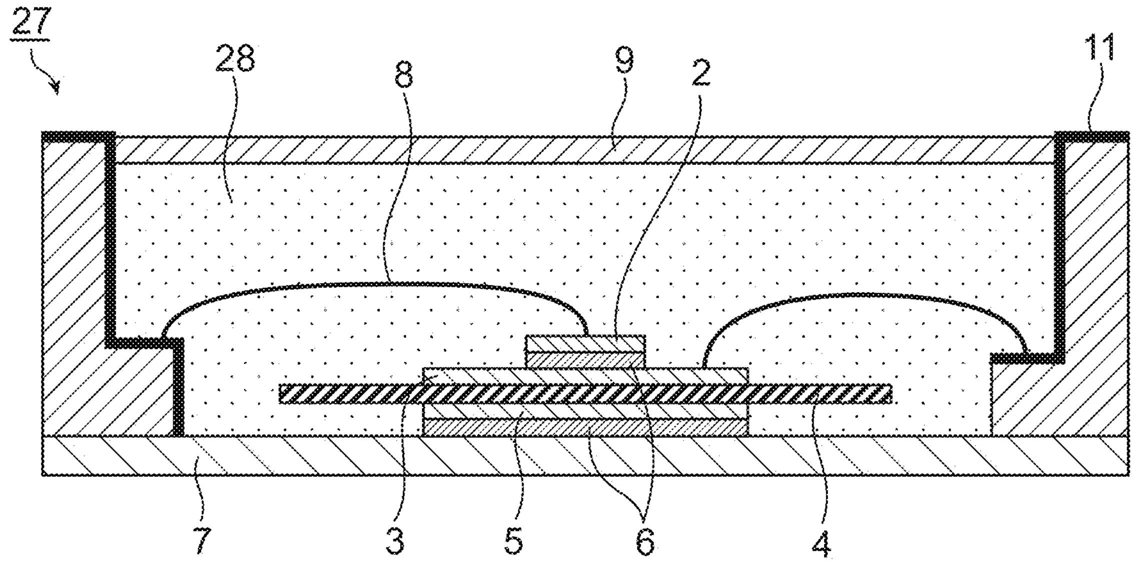
FIG. 8 is a cross-sectional view illustrating a case-type power semiconductor device (27) according to a seventh embodiment.

FIG. 8 is a cross-sectional view illustrating a power semiconductor device (case type) 27 according to the seventh embodiment. As shown in FIG. 8, the power semiconductor device (case type) 27 according to the seventh embodiment uses a mixed sealing resin 28 instead of the sealing resin 10. The mixed sealing resin 28 is obtained by mixing a heavy element material with the sealing resin 10.

Since the mixed sealing resin 28 contains a heavy element material, cosmic rays are prevented from entering the package. The fact that the mixed sealing resin 28 contains the heavy element material means that the heavy element material is used more than in the case of only the case 9 containing the heavy element material, and the radiation resistance is improved.

With the above configuration, the power semiconductor device (case type) 27 according to the seventh embodiment has an effect of improving radiation resistance in addition to the effect described in the first embodiment.

INDUSTRIAL APPLICABILITY

The present disclosed technology can be applied to power semiconductors for aircraft applications and the like, and has industrial applicability.

REFERENCE SIGNS LIST

1, 27: power semiconductor device (case type), 2: semiconductor chip, 3: upper electrode, 4: insulating substrate, 5: lower electrode, 6: solder, 7: base plate, 8: wire, 9: case, 10: sealing resin, 11: external terminal, 28: mixed sealing resin, 12, 17, 19, 21, 23, 25: power semiconductor device (transfer mold type), 2B: semiconductor chip, 8B: wire, 10B: transfer mold-type sealing resin, 13: sealing resin containing heavy element material, 14: sealing resin containing conductive material, 15: lead frame, 16: lead terminal, 18: barrier wall, 20: wavy structure, 22: metal layer, 24: mixed transfer mold resin, 26: non-mixed transfer mold resin

The invention claimed is:

1. A case-type power semiconductor device, wherein a case is formed by mixing a heavy element material and a conductive material with a material having high processability, the conductive material is not a light metal, and the case-type power semiconductor device further includes a semiconductor chip; and a lead terminal that is electrically connected to the semiconductor chip by a wire, an interface between an external terminal and the case is present, and the electric resistance of the case is 1.0 E5 to 1.0 E11 [Ω].

2. A transfer mold-type power semiconductor device, comprising:

a transfer mold-type sealing resin including a sealing resin containing a heavy element material and a sealing resin containing a conductive material, wherein the conductive material of the sealing resin containing a conductive material is not a light metal, the transfer mold-type power semiconductor device further includes a lead terminal that is adjacent to another lead terminal and connected to a semiconductor chip by a wire, and an interface between the lead terminal and the sealing resin containing a conductive material is present.

3. The transfer mold-type power semiconductor device according to claim 2, wherein a surface of an outer layer of the sealing resin containing a conductive material includes a barrier wall.

4. The transfer mold-type power semiconductor device according to claim 2, wherein a surface of an outer layer of the sealing resin containing a conductive material has a wavy structure.

5. The transfer mold-type power semiconductor device according to claim 2, further comprising a grounded metal layer being provided between the sealing resin containing a heavy element material and the sealing resin containing a conductive material.

* * * * *